(12) United States Patent
Hsiao

(10) Patent No.: US 7,196,998 B2
(45) Date of Patent: Mar. 27, 2007

(54) METHOD OF DETERMINING ADIP INFORMATION THROUGH COUNTING IDENTICAL BITS AND DIFFERENT BITS

(75) Inventor: Yuan-Kun Hsiao, Taipei Hsien (TW)

(73) Assignee: VIA Optical Solution, Inc., Hsin-Tien (TW)

( * ) Notice: Subject to any disclaimer, the term of this patent is extended or adjusted under 35 U.S.C. 154(b) by 330 days.

(21) Appl. No.: 10/709,023

(22) Filed: Apr. 7, 2004

(65) Prior Publication Data
US 2005/0018764 A1 Jan. 27, 2005

Related U.S. Application Data

(60) Provisional application No. 60/461,578, filed on Apr. 10, 2003.

(51) Int. Cl.
G11B 5/09 (2006.01)
G11B 7/00 (2006.01)

(52) U.S. Cl. ............... 369/59.2; 369/59.23; 369/53.31; 369/47.19

(58) Field of Classification Search ............ None
See application file for complete search history.

(56) References Cited

U.S. PATENT DOCUMENTS 5,475,666 A 12/1995 Ito et al.
5,689,482 A * 11/1997 Iida ............................ 369/30.1
6,333,902 B1 12/2001 Shim
6,345,023 B1 2/2002 Fushimi et al.
6,661,752 B2 12/2003 Eom
6,891,785 B2 5/2005 Yamamoto et al.
7,053,919 B2 5/2006 Nagano
2002/0131347 A1 9/2002 Raaymakers
2003/0043714 A1 3/2003 Takeda
2003/0179665 A1 9/2003 Iwazawa et al.
2004/0213119 A1* 10/2004 Van Vlerken et al. ..... 369/59.2
2005/0073923 A1* 4/2005 Tobita ..................... 369/47.28

FOREIGN PATENT DOCUMENTS

CN 1373474 A 10/2002
JP 11-353686 12/1999

* cited by examiner

Primary Examiner—Muhammad Edun
(74) Attorney, Agent, or Firm—Winston Hsu

(57) ABSTRACT

A method of identifying ADIP information through counting identical bits and different bits includes generating a wobble clock according to a wobble signal, generating a calculation result according to the wobble signal and the wobble clock, sampling the calculation result to generate a sampling signal and comparing each bit of the sampling signal with each bit of a bit stream containing an ADIP data, counting different bits corresponding to a predetermined logic value for generating a first bit count, and counting identical bits for generating a second bit count, and determining whether the calculation result corresponds to the ADIP data according to the first bit count and the second bit count.

21 Claims, 6 Drawing Sheets

METHOD OF DETERMINING ADIP INFORMATION THROUGH COUNTING IDENTICAL BITS AND DIFFERENT BITS

BACKGROUND OF INVENTION

1. Field of the Invention

The present invention relates in general to a method of identifying ADIP information, and more particularly, to a method of identifying ADIP information by counting identical bits having the same logic level and counting different bits having different logic levels.

2. Description of the Prior Art

Over the past few years, storage media have rapidly increased in storage capacity due to demand for storing a tremendous amount of information. Of all the various kinds of storage media, optical discs have features of a low-cost, small-size, low-error-rate, long-storage-time, and high-density storage medium and are the most promising dominant storage medium in the future. Generally speaking, optical disc drives are used to read information stored on an optical disc. Examples of optical disc drives are known as compact disc drives (CD-ROM drives) and digital versatile disc drives (DVD-ROM drives) in the prior art. Some optical disc drives have the additional capability of being able to write data onto an optical disc, i.e., CD-R/RW, DVD+R/RW and DVD-R/RW drivers. Optical disc drives are used in music and video playback and are implemented in recording devices and other electronic devices.

In order to effectively manage the information stored on a digital versatile disc, the data storage region of the digital versatile disc is divided into many frames. Data can be stored in these frames according to a memory format. Therefore, while in a writing process for a rewritable digital versatile disc, the DVD drive has to identify the memory format of the rewritable digital versatile disc before the writing process. In order to record the related information concerning the memory frames, there are special addressing structures on the rewritable digital versatile disc to record the related information. According to the specifications of a recordable or a rewritable digital versatile disc, the related information recorded in the addressing structures is known as the address in pre-groove (ADIP).

It is well-known that the information of the ADIP is recorded in the wobble signal by a phase modulation technique, which means that the information is recorded according to the phase shift of a carrier. Every pair of record areas on an optical disc corresponds to 93 wobble cycles, and 8 wobble cycles of them are utilized to record an ADIP by phase modulation. Therefore, an ADIP decoder is required to extract the ADIP from the wobble signal.

Please refer to FIG. 1. FIG. 1 shows a functional block diagram of a prior art optical disc drive system 10. The optical disc drive 10 comprises an optical disc 14 and an optical disc drive 12. The optical disc drive 12 is utilized to write or read a plurality of data to or from the optical disc 14. The optical disc drive 12 comprises an optical pickup 16, a wobble clock generator 18, an ADIP decoder 20, and a controller 22. In addition, the wobble clock generator 18 comprises a phase-locked loop (PLL) 28 and a frequency divider 29, and the ADIP decoder 20 comprises an XOR operation circuit 24 and a decision logic circuit 26.

As is well known in the specifications of a DVD+R disc drive or a DVD+RW disc drive, on the reflecting surface of the optical disc 14, there is a fine spiral track 15. The fine track 15 is composed of two types of tracks, one being a data track to record data having a value of 0 or 1, and the other being a wobble track to record related addressing information. The data track has an interrupt and discontinuity record mark, and the wobble track has an oscillating shape. The surface of the wobble track protrudes beyond the reflecting surface of the optical disc 14. The data track is located inside a groove formed by the raised wobble track. The length of each record mark varies, and the reflection characteristic of the record mark is different from that of the other reflecting surface of the optical disc. Consequently, the ADIP is recorded in the wobble track to assist the process of reading or writing data on the data track by the optical pickup 16. Thereby, the optical pickup 16 is able to extract the tracking information carried by the wobble track of the optical disc 14 and generates a wobble signal WBL. The information of the ADIP is then extracted from the wobble signal WBL by the ADIP decoder 20.

When an access process is being performed on the optical disc 14 by the optical disc drive 12, the optical pickup 16 emits an incident laser beam Li onto the reflecting surface of the optical disc 14, and the reflecting surface of the optical disc 14 reflects a corresponding reflected laser beam Lr back to the optical pickup 16. The intensity of the reflected laser beam Lr is then detected by a plurality of optical sensors (not shown) of the optical pickup 16 and is transformed to a plurality of electrical signals. By performing some well-known subtracting processes over the plurality of electrical signals, the wobble signal WBL can be generated. The wobble signal WBL is then forwarded to both the wobble clock generator 18 and the ADIP decoder 20. Thereafter, a non-phase-modulated wobble clock WBLCLK is generated by the wobble clock generator 18 based on the phase-modulated wobble signal WBL. As is shown in FIG. 1, the wobble signal WBL is first processed by the phase-locked loop 28 to generate a non-phase-modulated clock signal WOBCLK having a high frequency, the high-frequency clock signal WOBCLK is then processed by the frequency divider 29 to generate the wobble clock WBLCLK. In addition, the high-frequency clock signal WOBCLK is also utilized to generate other clock signals having different frequencies for driving other devices with the frequency divider 29. For instance, the frequency divider 29 generates a clock signal WBLCLK2 having a frequency that is twice the frequency of the wobble clock WBLCLK.

The XOR operation circuit 24 performs an XOR operation over the wobble clock WBLCLK and the wobble signal WBL and generates a calculation result ADIP_PRE. Subsequently, the decision logic circuit 26 is able to determine whether an effective ADIP is included in the calculation result ADIP_PRE. If there is an effective ADIP included in the calculation result ADIP_PRE, the ADIP is then forwarded to the controller 22. Thereafter, the controller 22 is able to access the data of the optical disc 14 with the aid of the ADIP.

FIGS. 2–4 are diagrams of schematic waveforms of the prior art wobble signals 30a, 30b, and 30c, having a time scale along the abscissa. The wobble signal 30a shown in FIG. 2 comprises 8 wobble cycles W0, W1, W2, W3, W4, W5, W6, and W7, which are utilized to record the information of an ADIP by phase modulation. As is shown in FIG. 2, a phase shift of 180° occurs at the beginning of the first phase-modulated cycle W0 of the wobble signal 30a. In addition, a phase shift of 180° also occurs between the wobble cycle W3 and the wobble cycle W4 of the wobble signal 30a. Consequently, the wobble signal 30a corresponds to an ADIP sync unit. As aforementioned, the wobble clock generator 18 is able to generate wobble clock WBLCLK based on the wobble signal 30a which is a phase-modulated signal. As is shown in FIG. 2, the wobble clock WBLCLK is a non-phase-modulated signal. Consequently, the ADIP recorded in the phase-modulated wobble signal 30a can be extracted by an XOR operation of the XOR operation circuit 24 with the aid of the wobble clock WBLCLK. Based on a cycle of the wobble clock WBLCLK as a unit, the cycle of the wobble signal 30a which is in phase with the cycle of the wobble clock WBLCLK corresponds to a bit of 1, and the cycle of the wobble signal 30a which is in opposite phase with the cycle of the wobble clock WBLCLK corresponds to a bit of 0. Accordingly, the ADIP sync unit of the wobble signal 30a corresponds to a bit stream of "11110000".

The wobble signal 30b shown in FIG. 3 comprises 8 wobble cycles W0, W1, W2, W3, W4, W5, W6, and W7, which are utilized to record the information of an ADIP by phase modulation. As is shown in FIG. 3, a phase shift of 180° occurs at the beginning of the first phase-modulated cycle W0 of the wobble signal 30b. In addition, a phase shift of 180° also occurs between the wobble cycle W0 and the wobble cycle W1 of the wobble signal 30b, and a phase shift of 180° further occurs between the wobble cycle W5 and the wobble cycle W6 of the wobble signal 30b. Consequently, the wobble signal 30b corresponds to an ADIP data unit having a corresponding logic level of 0. Similarly, the wobble clock generator 18 is able to generate wobble clock WBLCLK based on the wobble signal 30b which is a phase-modulated signal. As is shown in FIG. 3, the wobble clock WBLCLK is a non-phase-modulated signal. Consequently, the ADIP recorded in the phase-modulated wobble signal 30b can be extracted by an XOR operation of the XOR operation circuit 24 with the aid of the wobble clock WBLCLK. Based on a cycle of the wobble clock WBLCLK as a unit, the cycle of the wobble signal 30b which is in phase with the cycle of the wobble clock WBLCLK corresponds to a bit of 1, and the cycle of the wobble signal 30b which is in opposite phase with the cycle of the wobble clock WBLCLK corresponds to a bit of 0. Accordingly, the ADIP data unit of the wobble signal 30b having a logic level of 0 corresponds to a bit stream of "10000011".

The wobble signal 30c shown in FIG. 4 comprises 8 wobble cycles W0, W1, W2, W3, W4, W5, W6, and W7, which are utilized to record the information of an ADIP by phase modulation. As is shown in FIG. 4, a phase shift of 180° occurs at the beginning of the first phase-modulated cycle W0 of the wobble signal 30c. In addition, a phase shift of 180° also occurs between the wobble cycle W0 and the wobble cycle W1 of the wobble signal 30c, and a phase shift of 180° further occurs between the wobble cycle W3 and the wobble cycle W4 of the wobble signal 30c. Consequently, the wobble signal 30c corresponds to an ADIP data unit having a corresponding logic level of 1. Similarly, the wobble clock generator 18 is able to generate the wobble clock WBLCLK based on the wobble signal 30c which is a phase-modulated signal. As is shown in FIG. 4, the wobble clock WBLCLK is a non-phase-modulated signal. Consequently, the ADIP recorded in the phase-modulated wobble signal 30c can be extracted by an XOR operation of the XOR operation circuit 24 with the aid of the wobble clock WBLCLK. Based on a cycle of the wobble clock WBLCLK as a unit, the cycle of the wobble signal 30c which is in phase with the cycle of the wobble clock WBLCLK corresponds to a bit of 1, and the cycle of the wobble signal 30c which is in opposite phase with the cycle of the wobble clock WBLCLK corresponds to a bit of 0. Accordingly, the ADIP data unit of the wobble signal 30c having a logic level of 1 corresponds to a bit stream of "10001100".

According to the well-known specifications of the DVD+R optical drive and the DVD+RW optical drive, an ADIP unit corresponds to 93 wobble cycles and 8 wobble cycles of them are utilized to record an ADIP sync unit or an ADIP data unit by phase modulation. Accordingly, when the XOR operation circuit 24 performs XOR operations over the wobble signal WBL and the wobble clock WBLCLK to generate the calculation result ADIP_PRE, a bit stream of "11110000" of the calculation result ADIP_PRE will correspond to the ADIP sync unit of the wobble signal WBL. A comparison between the calculation result ADIP_PRE and the bit stream of "11110000" performed by the decision logic circuit 26 is able to determine whether the current wobble signal WBL corresponds to an ADIP sync unit.

Similarly, when the XOR operation circuit 24 performs XOR operations over the wobble signal WBL and the wobble clock WBLCLK to generate the calculation result ADIP_PRE, a bit stream of "10000011" of the calculation result ADIP_PRE will correspond to the ADIP data unit of the wobble signal WBL having a logic level of 0. A comparison between the calculation result ADIP_PRE and the bit stream of "11110000" performed by the decision logic circuit 26 is able to determine whether the current wobble signal WBL corresponds to an ADIP data unit having a logic level of 0. Likewise, when the XOR operation circuit 24 performs XOR operations over the wobble signal WBL and the wobble clock WBLCLK to generate the calculation result ADIP_PRE, a bit stream of "10001100" of the calculation result ADIP_PRE will correspond to the ADIP data unit of the wobble signal WBL having a logic level of 1. A comparison between the calculation result ADIP_PRE and the bit stream of "11110000" performed by the decision logic circuit 26 is able to determine whether the current wobble signal WBL corresponds to an ADIP data unit having a logic level of 1.

The schematic waveforms of the prior art wobble signals 30a, 30b, and 30c shown in FIGS. 2–4 are actually ideal waveforms for recording the ADIP data units and the ADIP sync units. However, the wobble signal WBL generated by the optical pickup 16 is affected by various kinds of factors. For instance, owing to the variation of the rotating speed of the spindle motor of the disc drive or any vibration caused by the disc eccentricity and the unstable light power of the emitting laser beam by the optical pickup 16, the variation of the light power of the reflected laser beam Lr may occur. In other words, because of the abovementioned interferences, the real waveforms of the wobble signals 30a, 30b, and 30c normally deviate from the ideal waveforms. Consequently, according to the prior art optical disc drive 12, the decision logic circuit 26 is required to perform a plurality of comparing operations to determine whether an effective ADIP is included in the calculation result ADIP_PRE. For instance, when the decision logic circuit 26 identifies a calculation result ADIP_PRE to be a bit stream of "10000111", although the bit stream of "10000111" is different from the bit stream of "10000011", the decision logic circuit 26 will still identify the calculation result ADIP_PRE to be an ADIP data unit having a logic level of 0, which actually corresponds to a bit stream of "10000011". In other words, the abovementioned interferences over the wobble signal WBL have been taken into consideration by the operation of the decision logic circuit 26. Therefore, when the decision logic circuit 26 determines whether an effective ADIP is included in the calculation result ADIP_PRE, the decision logic circuit 26 is required to utilize a plurality of predetermined bit streams for a sequential comparing process to identify the calculation result ADIP_PRE.

Consequently, a plurality of the registers are required by the decision logic circuit 26 to record the plurality of the predetermined bit streams and to perform a complex comparing operation, which causes a complicated and high-cost circuit for the optical disc drive 12.

SUMMARY OF INVENTION

It is therefore a primary objective of the claimed invention to provide a method of identifying ADIP information by counting identical bits having the same logic level and counting different bits having different logic levels for the optical disc drive using a cost-effective and labor saving circuit to solve the above-mentioned problems.

According to a preferred method of the claimed invention, the method of determining whether an effective ADIP is included in the calculation result of the wobble signal comprises generating a non-phase-modulated wobble clock based on the wobble signal, generating a calculation result based on the wobble signal and the wobble clock, sampling the calculation result to generate a sampling signal, calculating a first bit count of different bits and calculating a second bit count of identical bits based on the sampling signal, determining whether an effective ADIP is included in the calculation result based on the first bit count and the second bit count.

According to the abovementioned preferred method of the claimed invention, the first bit count is generated by counting corresponding different bits through an XOR operation over the sampling signal of the calculation result and an ideal bit stream, and the second bit count is generated by counting corresponding identical bits having the same logic level of 1 through an AND operation over the sampling signal of the calculation result and the ideal bit stream. Thereafter, the method is able to determine whether the ADIP having the ideal bit stream is included in the calculation result. Consequently, only a first critical value and a second critical value are required to compare with the first bit count and the second bit count respectively for determining whether an effective ADIP is included in the calculation result. In other words, the number of registers required in the optical disc drive designed based on the method of the claimed invention can be reduced, which results in a cost-effective and labor saving circuit design for the optical drive.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
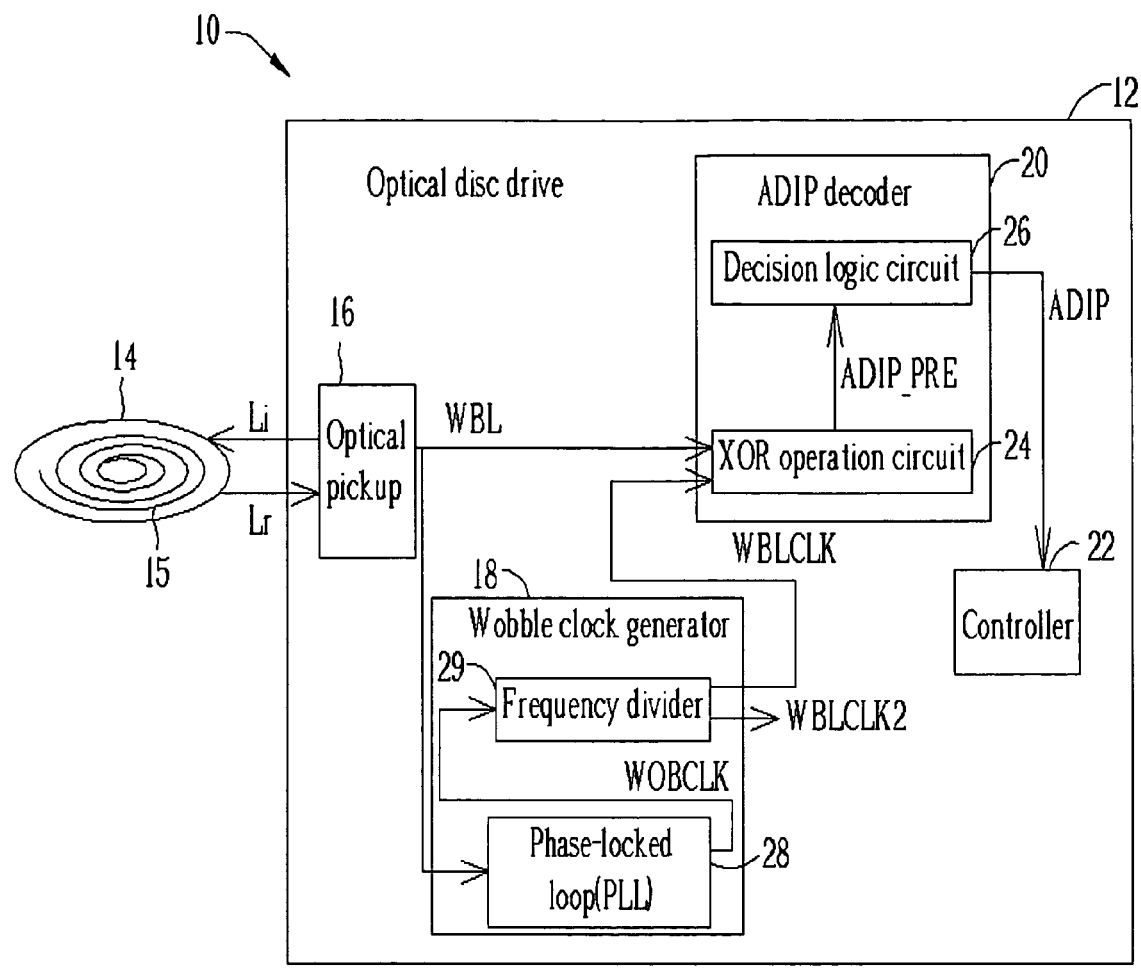
FIG. 1 shows a functional block diagram of a prior art optical disc drive system.
Figure 2:
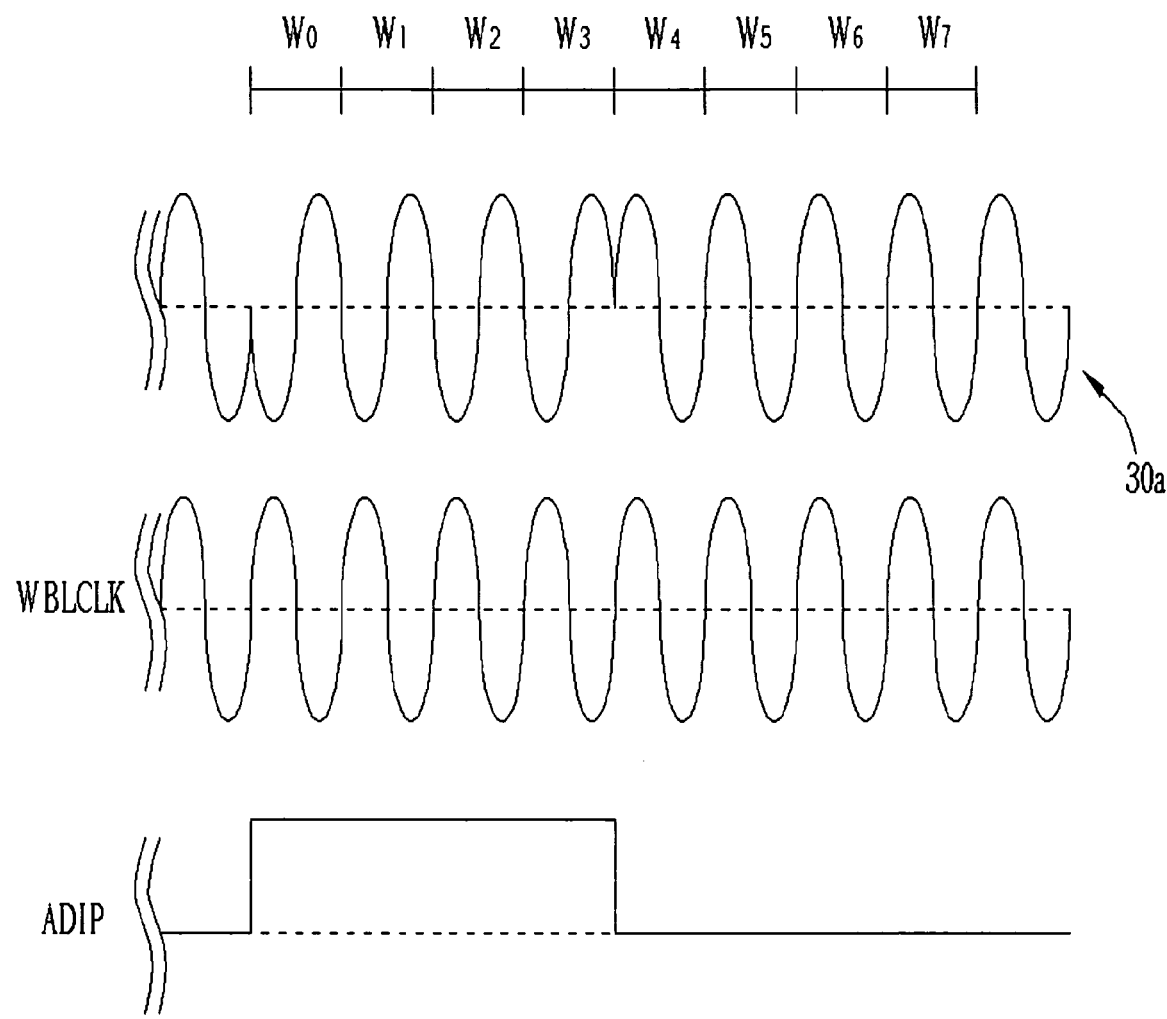
FIGS. 2–4 are diagrams of schematic waveforms of the prior art wobble signals.
Figure 3:
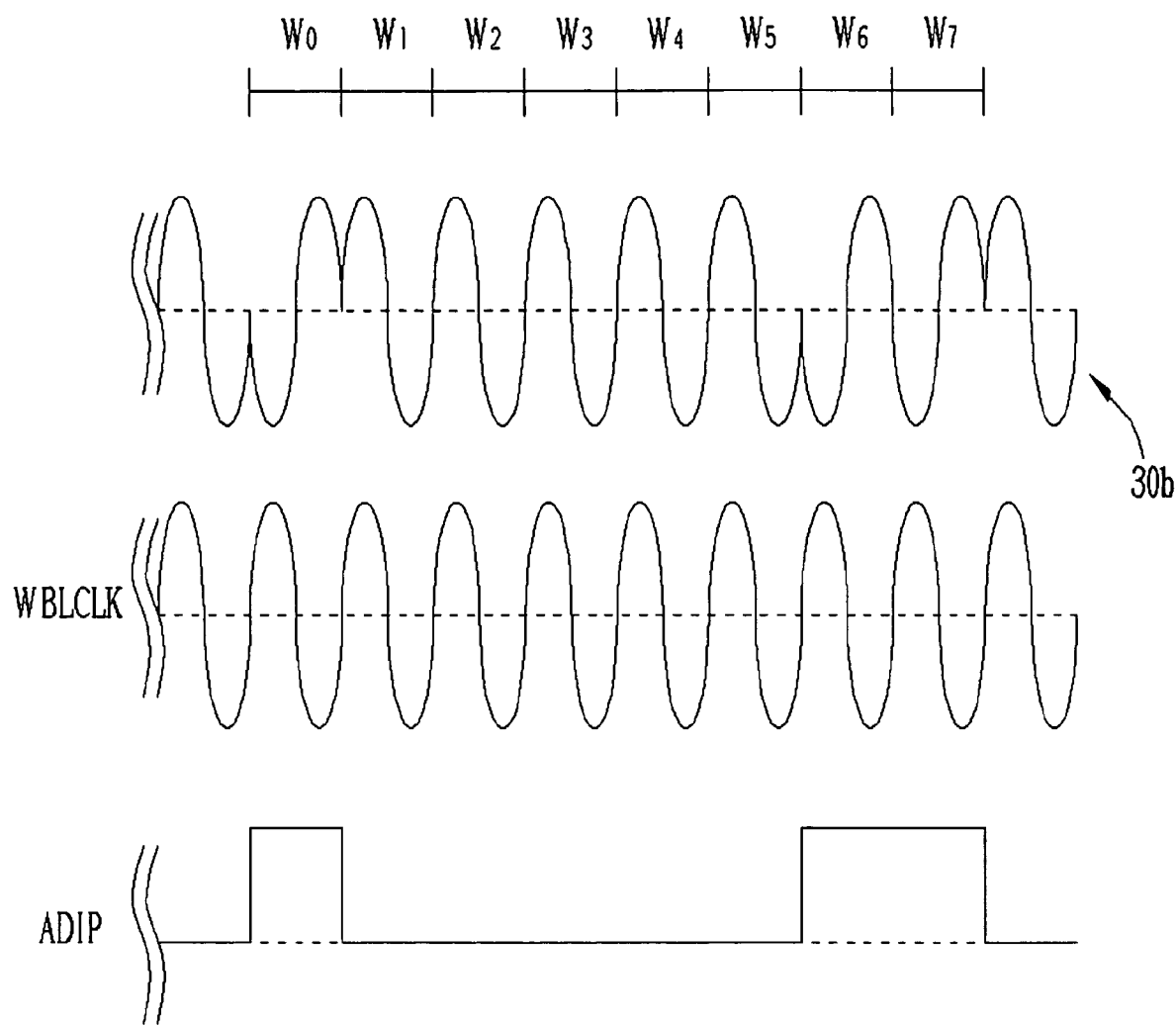
Figure 4:
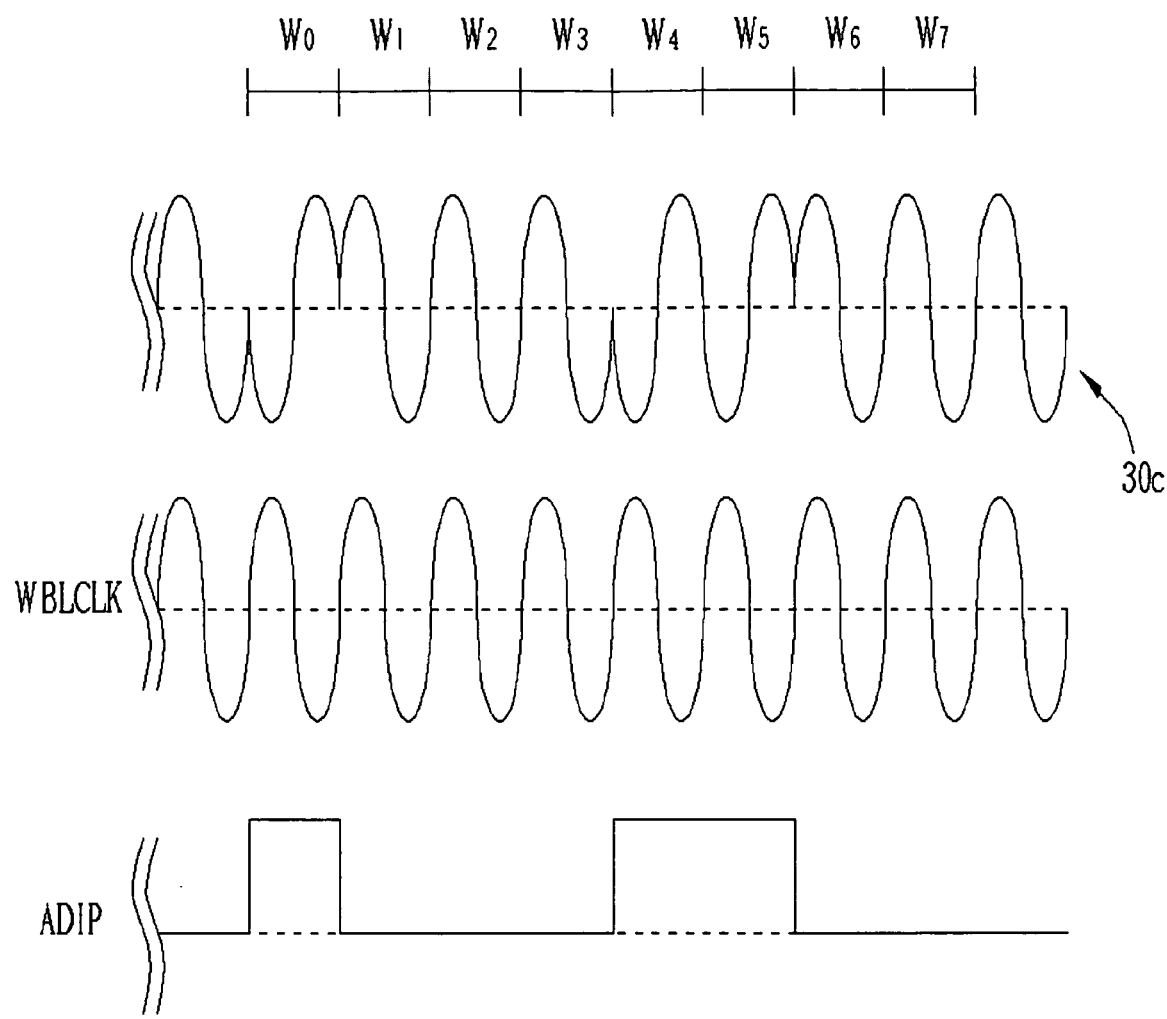
Figure 5:
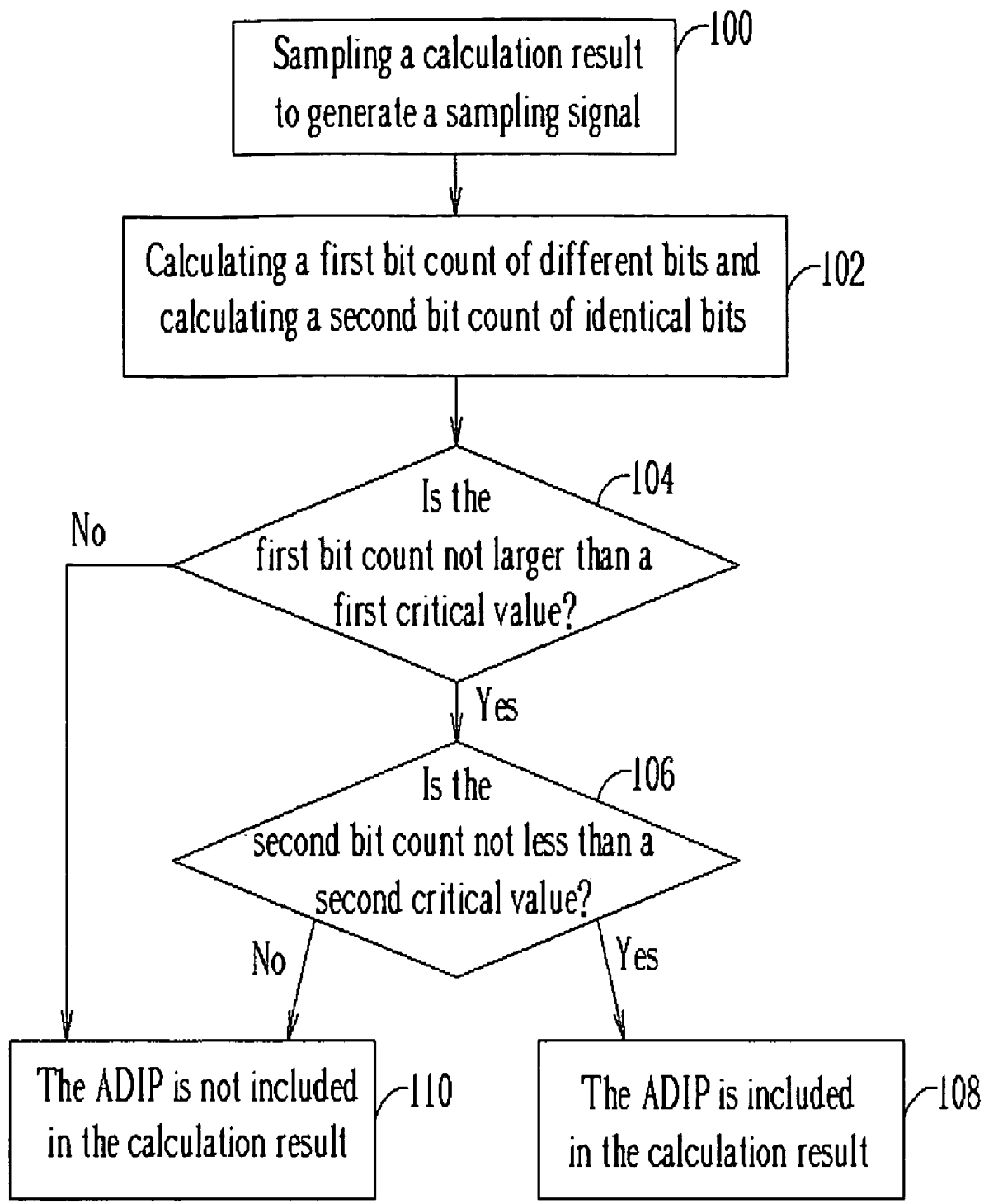
FIG. 5 is a flow diagram of the method of identifying ADIP information according to the present invention.

FIG. 5 is a flow diagram of the method of identifying ADIP information according to the present invention. The method is applied to the optical disc drive 12 for decoding the phase-modulated wobble signal and determining whether an effective ADIP is included in the wobble signal. The optical disc drive 12 can be a DVD-R optical disc drive or a DVD-RW optical disc drive. A routine with the following functional steps (FIG. 5 refers) is embodied into the control routine of the optical disc drive governing the wobble signal decoding processes:

100 Generating a sampling signal ADIP_S by sampling the calculation result ADIP_PRE with the aid of a reference clock WBLCLK2.
102 Calculating a first bit count N1 by counting corresponding different bits through an XOR operation over the sampling signal ADIP_S and an ideal bit stream, and calculating a second bit count N2 by counting corresponding identical bits through an AND operation over the sampling signal ADIP_S and an ideal bit stream.
104 Is the first bit count N1 not larger than a first critical value? If 'yes', then proceed to step 106. Otherwise, proceed to step 110.
106 Is the second bit count N2 not less than a second critical value? If 'yes', then proceed to step 108. Otherwise, proceed to step 110.
108 Concluding that there is an effective ADIP included in the current calculation result ADIP_PRE.
110 Concluding that there is no effective ADIP included in the current calculation result ADIP_PRE.

Figure 6:
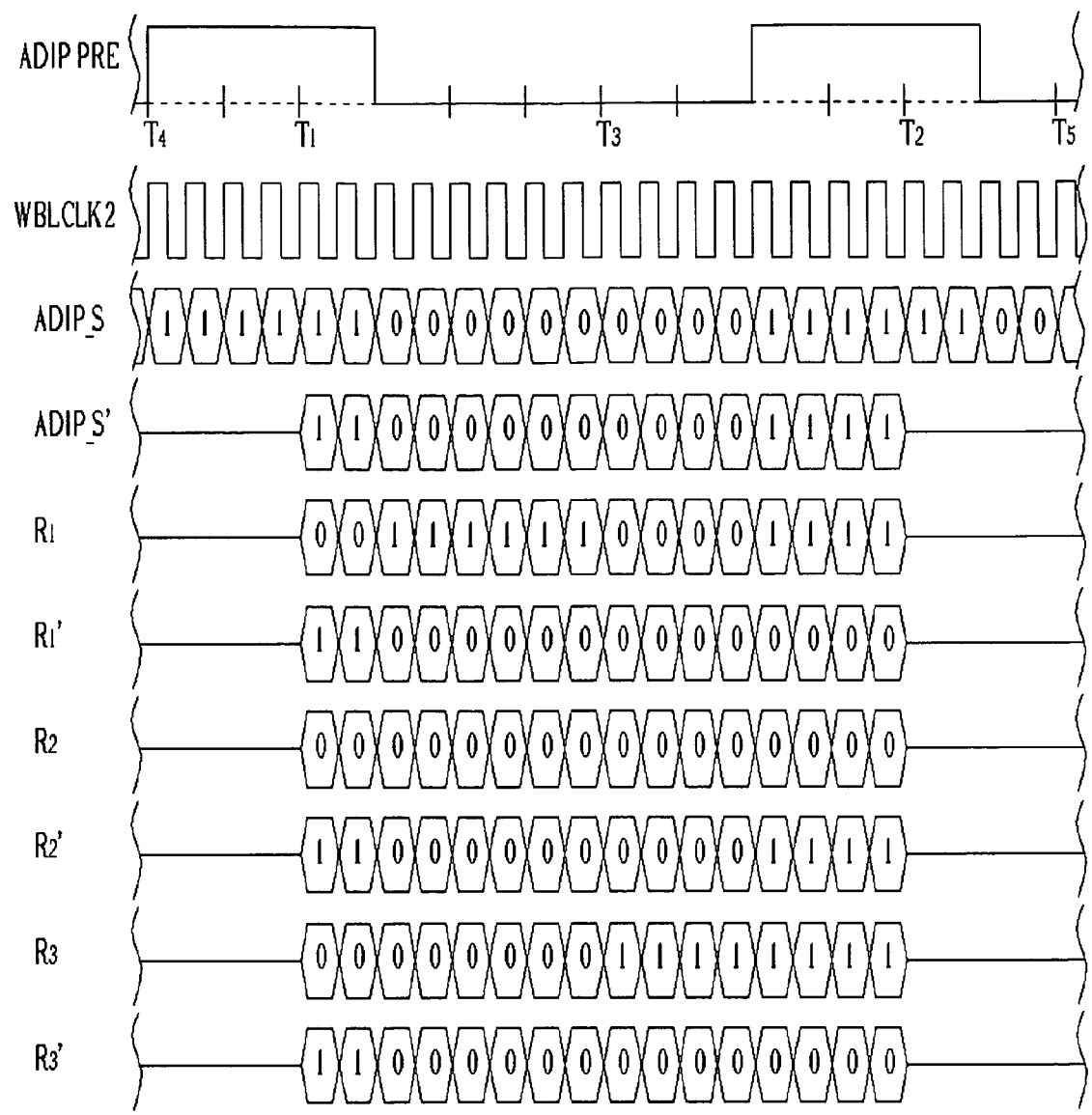
FIG. 6 is a diagram of schematic waveforms of the related signals for the operation of the method of identifying ADIP information according to the present invention.

Please refer to FIG. 6. FIG. 6, having a time scale along the abscissa, is a diagram of schematic waveforms of the related signals for the operation of the method of identifying ADIP information according to the present invention. The sampling signal is generated by sampling the calculation result ADIP_PRE with the aid of a reference clock WBLCLK2. The calculation result ADIP_PRE is generated by an XOR operation over the wobble signal WBL and the wobble clock WBLCLK. The frequency of the reference clock WBLCLK2 is twice the frequency of the wobble clock WBLCLK. Consequently, if there are N bits of the sampling signal generated by sampling the calculation result ADIP_PRE with the aid of the rising edges of the wobble clock WBLCLK, then corresponding 2N bits of the sampling signal will be generated by sampling the calculation result ADIP_PRE with the aid of the rising edges of the reference clock WBLCLK2. In other words, the sampling signal ADIP_S generated by sampling the calculation result ADIP_PRE with the aid of the reference clock WBLCLK2 achieves a higher resolution (FIG. 5, step 100 refers). Thereof, the sampling signal of the ADIP sync unit of the calculation result ADIP_PRE generated based on the reference clock WBLCLK2 corresponds to an ideal bit stream S1 of "1111111100000000". The sampling signal of the ADIP data unit of the calculation result ADIP_PRE having a logic level of 0 generated based on the reference clock WBLCLK2 corresponds to an ideal bit stream S2 of "1100000000001111". The sampling signal of the ADIP data unit of the calculation result ADIP_PRE having a logic level of 1 generated based on the reference clock WBLCLK2 corresponds to an ideal bit stream S3 of "1100000001110000".

As is shown in FIG. 6, there are 8 wobble cycles corresponding to the calculation result ADIP_PRE during the time between T1 and T2, and the corresponding sampling signal ADIP_S' is a bit stream of "1100000000001111". Thereafter, three bit streams of R1, R2, and R3 shown in FIG. 6 are generated by performing three XOR operations over the sampling signal ADIP_S' and the ideal bit streams of S1, S2, and S3 respectively. In addition, three bit streams of R1', R2', and R3' shown in FIG. 6 are generated by performing three AND operations over the sampling signal ADIP_S' and the ideal bit streams of S1, S2, and S3 respectively. Subsequently, three first bit counts are generated by counting the numbers of bits having a logic level of 1 in the bit streams of R1, R2, and R3, and three second bit counts are generated by counting the numbers of bits having a logic level of 1 in the bit streams of R1', R2', and R3' (FIG. 5, step 102 refers).

According to the preferred method of the claimed invention, the sampling signal ADIP_S' and the ideal bit streams of S1, S2, and S3 are partitioned into two subdivisions individually, and the first bit count and the second bit count are calculated based on each subdivision. For instance, the sampling signal ADIP_S' is partitioned into two subdivisions. The two subdivisions of the sampling signal ADIP_S' comprise a first subdivision corresponding to a bit stream of "11000000" during the time between T1 and T3 and a second subdivision corresponding to a bit stream of "0000111" during the time between T3 and T2. Similarly, the ideal bit stream of S1 is partitioned into two subdivisions having a first subdivision corresponding to a bit stream of "11111111" and a second subdivision corresponding to a bit stream of "00000000". The ideal bit stream of S2 is partitioned into two subdivisions having a first subdivision corresponding to a bit stream of "11000000" and a second subdivision corresponding to a bit stream of "00001111". The ideal bit stream of S3 is partitioned into two subdivisions having a first subdivision corresponding to a bit stream of "11000000" and a second subdivision corresponding to a bit stream of "11110000".

Taking the sampling signal ADIP_S' and the ideal stream of S1 for example, after the XOR operations over the two subdivisions of the sampling signal ADIP_S' and the two subdivisions of the ideal stream of S1, the bit stream of R1 is generated. The bits having a logic level of 1 in the bit stream of R1 correspond to the bits having different logic levels between the sampling signal ADIP_S' and the bit stream of S1. The bit stream of R1 is also partitioned into two subdivisions. The two subdivisions of the bit stream of R1 comprise a first subdivision having a bit stream of "00111111" and a second subdivision having a bit stream of "00001111". A bit count D11 having a value of 6 is then generated by counting the number of bits having a logic level of 1 in the first subdivision of the bit stream of R1, and a bit count D12 having a value of 4 is then generated by counting the number of bits having a logic level of 1 in the second subdivision of the bit stream of R1.

Furthermore, after the AND operations over the two subdivisions of the sampling signal ADIP_S' and the two subdivisions of the ideal stream of S1, the bit stream of R1' is generated. The bits having a logic level of 1 in the bit stream of R1' correspond to the bits having the same logic level of 1 between the sampling signal ADIP_S' and the bit stream of S1. The bit stream of R1' is also partitioned into two subdivisions. The two subdivisions of the bit stream of R1' comprise a first subdivision having a bit stream of "11000000" and a second subdivision having a bit stream of "00000000". A bit count D13 having a value of 2 is then generated by counting the number of bits having a logic level of 1 in the first subdivision of the bit stream of R1', and a bit count D14 having a value of 0 is then generated by counting the number of bits having a logic level of 1 in the second subdivision of the bit stream of R1'.

Thereafter, the bit counts D11 and D13 corresponding to the first subdivisions of the bit streams of R1 and R1' are compared with the predetermined first and second critical values H11 and H12 respectively, and the bit counts D12 and D14 corresponding to the second subdivisions of the bit streams of R1 and R1' are compared with the predetermined first and second critical values H21 and H22 respectively. The first critical values are utilized to evaluate the results of the XOR operations, and the second critical values are utilized to evaluate the results of the AND operations. Each subdivision has its corresponding first and second critical values. The first critical values and the second critical values are all adjustable. For instance, both the first critical values H11 and H21 of the first and the second subdivisions can be predetermined to be 2, and the second critical value H12 of the first subdivision can be predetermined to be 6. The setting of the second critical value H22 of the second subdivision is omitted because the second division of S1 corresponds to an ideal bit stream of "00000000", and any AND operation related to the ideal bit stream of "00000000" must have a result bit stream of "00000000". The setting of the critical values is based on the error tolerable range of the optical disc drive system 10. Because both the bit counts D11 and D12 are larger than the predetermined first critical values H11 and H21 respectively (FIG. 5, step 104 refers), which means the number of different bits between the sampling signal ADIP_S' and the ideal bit stream of S1 is not tolerable, it is then determined that the ADIP sync unit is not included in the calculation result ADIP_PRE during the time between T1 and T2 (FIG. 5, step 110 refers). Please note that the step 106 is skipped in the operating procedure, which means that the comparing process for the second bit count and the second critical value is omitted without affecting the result of the operating procedure.

In fact, when the bit count D11 is larger than the predetermined first critical value H11, the skipping operation enacts immediately, which means the comparing process for the first critical value H21 and the bit count D12 can be also omitted.

Taking the sampling signal ADIP_S' and the ideal stream of S2 for example, after the XOR operations over the two subdivisions of the sampling signal ADIP_S' and the two subdivisions of the ideal stream of S2, the bit stream of R2 is generated. The bits having a logic level of 1 in the bit stream of R2 correspond to the bits having different logic levels between the sampling signal ADIP_S' and the bit stream of S2. The bit stream of R2 is also partitioned into two subdivisions. The two subdivisions of the bit stream of R2 comprise a first subdivision having a bit stream of "00000000" and a second subdivision having a bit stream of "00000000". A bit count D21 having a value of 0 is then generated by counting the number of bits having a logic level of 1 in the first subdivision of the bit stream of R2, and a bit count D22 having a value of 0 is then generated by counting the number of bits having a logic level of 1 in the second subdivision of the bit stream of R2.

Furthermore, after the AND operations over the two subdivisions of the sampling signal ADIP_S' and the two subdivisions of the ideal stream of S2, the bit stream of R2' is generated. The bits having a logic level of 1 in the bit stream of R2' correspond to the bits having the same logic level of 1 between the sampling signal ADIP_S' and the bit stream of S2. The bit stream of R2' is also partitioned into two subdivisions. The two subdivisions of the bit stream of R2' comprise a first subdivision having a bit stream of "11000000" and a second subdivision having a bit stream of "00001111". A bit count D23 having a value of 2 is then generated by counting the number of bits having a logic level of 1 in the first subdivision of the bit stream of R2', and a bit count D24 having a value of 4 is then generated by counting the number of bits having a logic level of 1 in the second subdivision of the bit stream of R2'.

Thereafter, the bit counts D21 and D23 corresponding to the first subdivisions of the bit streams of R2 and R2' are compared with the predetermined first and second critical values H11 and H12 respectively, and the bit counts D22 and D24 corresponding to the second subdivisions of the bit streams of R2 and R2' are compared with the predetermined first and second critical values H21 and H22 respectively. The first critical values are utilized to evaluate the results of the XOR operations, and the second critical values are utilized to evaluate the results of the AND operations. Each subdivision has its corresponding first and second critical values. The first critical values and the second critical values are all adjustable. For instance, both the first critical values H11 and H21 of the first and the second subdivisions can be predetermined to be 1, the second critical value H12 of the first subdivision can be predetermined to be 1, and the second critical value H22 of the second subdivision can be predetermined to be 3. Similarly, the setting of the critical values is based on the error tolerable range of the optical disc drive system 10. Because both the bit counts D21 and D22 are less than the predetermined first critical values H11 and H21 respectively (FIG. 5, step 104 refers), which means the number of different bits between the sampling signal ADIP_S' and the ideal bit stream of S1 is tolerable, it is then determined that the operation procedure should proceed to step 106. Therefore, the comparing processes for the second bit counts, D23 and D24, and the second critical values, H12 and H22, are performed (FIG. 5, step 106 refers). Because the bit count D23 is less than the predetermined second critical values H12 and the bit count D24 is less than the predetermined second critical values H22, it is then determined that the ADIP data unit having a logic value of 0 is included in the calculation result ADIP_PRE during the time between T1 and T2 (FIG. 5, step 108 refers).

Taking the sampling signal ADIP_S' and the ideal stream of S3 for example, after the XOR operations over the two subdivisions of the sampling signal ADIP_S' and the two subdivisions of the ideal stream of S3, the bit stream of R3 is generated. The bits having a logic level of 1 in the bit stream of R3 correspond to the bits having different logic levels between the sampling signal ADIP_S' and the bit stream of S3. The bit stream of R3 is also partitioned into two subdivisions. The two subdivisions of the bit stream of R3 comprise a first subdivision having a bit stream of "00000000" and a second subdivision having a bit stream of "11111111". A bit count D31 having a value of 0 is then generated by counting the number of bits having a logic level of 1 in the first subdivision of the bit stream of R3, and a bit count D32 having a value of 8 is then generated by counting the number of bits having a logic level of 1 in the second subdivision of the bit stream of R3.

Furthermore, after the AND operations over the two subdivisions of the sampling signal ADIP_S' and the two subdivisions of the ideal stream of S3, the bit stream of R3' is generated. The bits having a logic level of 1 in the bit stream of R3' correspond to the bits having the same logic level of 1 between the sampling signal ADIP_S' and the bit stream of S3. The bit stream of R3' is also partitioned into two subdivisions. The two subdivisions of the bit stream of R3' comprise a first subdivision having a bit stream of "11000000" and a second subdivision having a bit stream of "00000000". A bit count D33 having a value of 2 is then generated by counting the number of bits having a logic level of 1 in the first subdivision of the bit stream of R3', and a bit count D34 having a value of 0 is then generated by counting the number of bits having a logic level of 1 in the second Thereafter, the bit counts D31 and D33 corresponding to the first subdivisions of the bit streams of R3 and R3' are compared with the predetermined first and second critical values H11 and H12 respectively, and the bit counts D32 and D34 corresponding to the second subdivisions of the bit streams of R3 and R3' are compared with the predetermined first and second critical values H21 and H22 respectively. The first critical values are utilized to evaluate the results of the XOR operations, and the second critical values are utilized to evaluate the results of the AND operations. Each subdivision has its corresponding first and second critical values. Again, the first critical values and the second critical values are all adjustable. For instance, both the first critical values H11 and H21 of the first and the second subdivisions can be predetermined to be 1, the second critical value H12 of the first subdivision can be predetermined to be 1, and the second critical value H22 of the second subdivision can be predetermined to be 3. The setting of the critical values is based on the error tolerable range of the optical disc drive system 10. Although the bit count D31 is less than the predetermined first critical value H11, but the bit count D32 is larger than the predetermined first critical value H21 (FIG. 5, step 104 refers), which means the number of different bits between the sampling signal ADIP_S' and the ideal bit stream of S3 is not tolerable. It is then determined that the ADIP data unit having a logic level of 1 is not included in the calculation result ADIP_PRE during the time between T1 and T2 (FIG. 5, step 110 refers). Again, the step 106 is skipped in the operating procedure, which means that the comparing process for the second bit count and the second critical value is omitted without affecting the result of the operating procedure.

It is well-known that a cycle of the wobble clock WBLCLK corresponds to 32T. According to the preferred method of the claimed invention, the sampling signal ADIP_S is generated from the calculation result ADIP_PRE based on the reference clock WBLCLK2 having a frequency of twice the frequency of the wobble clock WBLCLK. In other words, a cycle of the reference clock WBLCLK2 corresponds to 16T. Therefore, the decision logic circuit 26 is required to sample a bit of the sampling signal ADIP_S for each interval of 16T. Accordingly, the sampling signal ADIP_S' keeps refreshing to proceed with the identifying process for the ADIP decoding. Based on the above description, the identifying process for each sampling signal ADIP_S' is required to complete within a period of 16T. The identifying process of the claimed invention is performed by comparing the sampling signal ADIP_S' with each of the ideal streams of S1, S2, and S3. Each of the bit streams of R1, R1', R2, R2', R3, and R3' is partitioned into two subdivisions, and which results in a plurality of bit counts of D11, D12, D13, D14, D21, D22, D23, D24, D31, D32, D33, and D34. The main reason of the partitioning process is to reduce the processing time to be lower than the period time limit of 16T.

For instance, because each subdivision of the ideal bit streams of R1 or R1' comprises 8 bits, if the 8 bits of the first subdivision of the bit stream R1 are all having a logic level of 1, then the bit count D11 equals to a maximum decimal value of 8. Similarly, the maximum decimal values of the bit counts of D12, D13, and D14 are all equal to 8. It is well-known that a 4-bit adder is able to record a binary number of "1000", which is the decimal number of 8. Therefore, eight 4-bit adders are required for the decision logic circuit 26 to calculate the 12 bit counts of D11, D12, D13, D14, D21, D22, D23, D24, D31, D32, D33, and D34. Because each subdivision comprises 8 bits, each of the 4-bit adders is required to perform 8 adding processes for the 8 bits of each subdivision. If the adding time for each adding process corresponds to 1T, then the processing time of the step 102 corresponds to 8T. Consequently, the duration of the identifying process for each sampling signal ADIP_S' is able to meet the requirement of time limit of 16T.

As is described above, the eight wobble cycles during the time between T1 and T2 are identified as an ADIP data unit having a logic value of 0. However, based on the calculation result ADIP_PRE during the time between T4 and T5, it is obvious that the identifying of the eight wobble cycles as an ADIP data unit having a logic value of 0 is actually an error. Consequently, in order to avoid the error, the cycles before and after the eight wobble cycles are required to be taken into consideration. Thereby, according to another preferred method of the claimed invention, the identifying of the calculation result ADIP_PRE is based on more than eight wobble cycles to improve the accuracy of the identifying process. For instance, there are two more wobble cycles before the eight wobble cycles during the time between T4 and T1 which are taken into consideration, and furthermore there are two more wobble cycles after the eight wobble cycles during the time between T2 and T5 which are taken into consideration. In other words, twelve wobble cycles during the time between T4 and T5 are taken into consideration for the identifying process. Similarly, the sampling signal ADIP_S' is partitioned into two subdivisions to reduce the processing time, and each of the ideal bit streams of S1, S2, and S3 is also partitioned into two subdivisions.

For instance, the two subdivisions of the ideal stream of S1 corresponds to "000011111111" and "000000000000", the two subdivisions of the ideal stream of S2 corresponds to "000011000000" and "000011110000", and the two subdivisions of the ideal stream of S3 corresponds to "000011000000" and "111100000000". Each subdivision corresponds to 12 bits, which means the maximum value of a bit count is a decimal number of 12. Again, eight 4-bit adders are required for the decision logic circuit 26 to calculate the 12 bit counts. Because each subdivision comprises 12 bits, each of the 4-bit adders is required to perform 12 adding processes for the 12 bits of each subdivision. If the adding time for each adding process corresponds to 1T, then the processing time of the step 102 corresponds to 12T. Consequently, the duration of the identifying process for each sampling signal ADIP_S' is still able to meet the requirement of time limit of 16T.

In addition, because there are more than eight wobble cycles which are taken into consideration, if there are interferences before or after the eight wobble cycles, then the first bit count of different bits at step 102 increases significantly. Thereafter, the step 104 is able to determine that there is no effective ADIP included in the current calculation result ADIP_PRE. Accordingly, with the aid of some extra wobble cycles, the identifying method of the claimed invention improves the identifying accuracy significantly.

Compared to the prior art, the identifying method of the claimed invention identifies the current calculation result ADIP_PRE by calculating a first bit count of different bits and calculating a second bit count of identical bits based on a plurality of ideal bit streams. Two adjustable first and second critical values are utilized to compare with the first and the second bit counts. If the first bit count is larger than the first critical value or the second bit count is less than the second critical value, then it is determined that the corresponding ADIP unit is not included in the current calculation result ADIP_PRE. Consequently, only a first critical value and a second critical value are required to compare with the first bit count and the second bit count respectively for determining whether an effective ADIP is included in the calculation result ADIP_PRE. As a result, compared to the prior art, the number of registers required in the optical disc drive designed based on the method of the claimed invention can be reduced significantly, which results in a cost-effective and labor saving circuit design for the optical drive.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of determining whether an ADIP unit is included in a calculation result, the method comprising:
    performing a first determining process by calculating a first bit count based on a sampling signal and an ideal bit stream; and
    comparing the first bit count with a first critical value to determine whether the ADIP unit is included in the calculation result;
    wherein when the first determining process related to the first bit count is not able to determine whether the ADIP unit is included in the calculation result, a second determining process is performed based on the sampling signal and the ideal bit stream.

2. The method of claim 1 further comprising:
    generating a non-phase-modulated target clock signal based on a phase-modulated input signal; and
    generating the calculation result by performing an XOR operation over the target clock signal and the input signal.

3. The method of claim 2 further comprising:
    sampling the calculation result at twice the frequency of the target clock signal to generate a sampling signal.

4. The method of claim 1, wherein the first bit count is generated by performing an XOR operation to count the number of bits having different logic levels between the sampling signal and the ideal bit stream.

5. The method of claim 1, wherein when the first bit count is larger than a first critical value, it is determined that the ADIP unit is not included in the calculation result.

6. The method of claim 1, wherein when the first bit count is not larger than a first critical value, the second determining process is performed by generating a second bit count based on the sampling signal and the ideal bit stream.

7. The method of claim 6, wherein the second determining process is performed with the aid of an AND operation over the sampling signal and the ideal bit stream, the second bit count is generated by counting the number of bits having the same logic level between the sampling signal and the ideal bit stream.

8. The method of claim 6 further comprising:
    comparing the second bit count with a second critical value; and
    determining that the ADIP unit is not included in the calculation result when the second bit count is less than the second critical value.

9. The method of claim 6 further comprising:
    comparing the second bit count with a second critical value; and
    determining that the ADIP unit is included in the calculation result when the second bit count is not less than the second critical value.

10. A method of determining whether an ADIP unit is included in a calculation result, the method comprising:
- partitioning a sampling signal into a plurality of subdivisions of the sampling signal;
- performing a first determining process by calculating a plurality of first bit counts based on each of the plurality of subdivisions of the sampling signal and each of a plurality of corresponding ideal bit streams; and
- comparing each of the first bit counts with each of a plurality of corresponding first critical values to determine whether the ADIP unit is included in the calculation result;
- wherein when the first determining process related to the first bit counts is not able to determine whether the ADIP unit is included in the calculation result, a second determining process is performed based on each of the plurality of subdivisions of the sampling signal and each of the plurality of corresponding ideal bit streams.

11. The method of claim 10 further comprising:
- generating a non-phase-modulated target clock signal based on a phase-modulated input signal; and
- generating the calculation result by performing an XOR operation over the target clock signal and the input signal.

12. The method of claim 11 further comprising:
sampling the calculation result at twice the frequency of the target clock signal to generate a sampling signal.

13. The method of claim 11, wherein the input signal is a wobble signal of an optical disc and the target clock signal is a wobble clock.

14. The method of claim 10, wherein each of the first bit counts is generated by performing an XOR operation to count the number of bits having different logic levels between each of the plurality of subdivisions of the sampling signal and each of the plurality of the corresponding ideal bit streams.

15. The method of claim 10, wherein when at least one of the first bit counts is larger than the corresponding first critical value, it is determined that the ADIP unit is not included in the calculation result.

16. The method of claim 10, wherein when every one of the first bit counts is not larger than the corresponding first critical values, the second determining process is performed by generating a plurality of second bit counts based on each of the plurality of subdivisions of the sampling signal and each of the plurality of the corresponding ideal bit streams.

17. The method of claim 16, wherein the second determining process is performed with the aid of an AND operation over each of the plurality of subdivisions of the sampling signal and each of the plurality of corresponding ideal bit streams, each of the second bit counts is generated by counting the number of bits having the same logic level between each of the plurality of subdivisions of the sampling signal and each of the plurality of the corresponding ideal bit streams.

18. The method of claim 16 further comprising:
- comparing each of the plurality of the second bit counts with each of a plurality of corresponding second critical values; and
- determining that the ADIP unit is not included in the calculation result when at least one of the second bit counts is less than the corresponding second critical value.

19. The method of claim 16 further comprising:
- comparing each of the plurality of the second bit counts with each of a plurality of corresponding second critical values; and
- determining that the ADIP unit is included in the calculation result when every one of the second bit counts is not less than the corresponding second critical value.

20. The method of claim 10, wherein the ideal bit stream includes an ADIP sync unit or an ADIP data unit.

21. The method of claim 10 being applied to an optical disc drive system.

* * * * *